United States Patent
Atoji

[19]

[11] Patent Number: 6,103,009

[45] Date of Patent: Aug. 15, 2000

[54] FABRICATION PROCESS FOR A SOI SUBSTRATE

[75] Inventor: Tadashi Atoji, Machida, Japan

[73] Assignee: Canon Kabushiki Kaisha, Tokyo, Japan

[21] Appl. No.: 08/760,670

[22] Filed: Dec. 9, 1996

[30] Foreign Application Priority Data

Dec. 12, 1995 [JP] Japan ................................. 7-322921
Dec. 5, 1996 [JP] Japan ................................. 8-325105

[51] Int. Cl.⁷ ................................................. C30B 33/08
[52] U.S. Cl. ............................ 117/97; 117/91; 117/95; 438/459
[58] Field of Search ........................ 117/91, 95, 97; 438/459, 479, 486, 753, 960

[56] References Cited

U.S. PATENT DOCUMENTS

| 5,371,037 | 12/1994 | Yonehara . | |
| 5,492,859 | 2/1996 | Sakaguchi et al. | 438/246 |
| 5,670,411 | 9/1997 | Yonehara et al. | 438/304 |

FOREIGN PATENT DOCUMENTS

| 0528299 | 7/1992 | European Pat. Off. | H01L 21/76 |
| 0554795 | 1/1993 | European Pat. Off. | H01L 21/84 |

OTHER PUBLICATIONS

Nobuhiko Sato et al., "Epitaxial Growth On Porous Si For A new Bond And Etch–Back Soi", Proceedings of the Int'l. Symposium on Silicon Materials Science and Technology, 1994, pp. 443–454.

L. Vescan, et al., "Low–Pressure Vapor–Phase Epitaxy of Silicon On Porous Silicon" 1988, vol. 7, pp. 94–98.

K. Sakaguchi, et al., "Extremely High Selective Etching of Porous Si for Single Etch–Stop Bond–and–Etch–Back SOI", International Conference on Solid State Devices and Materials, 1994, pp. 259,161.

*Primary Examiner*—Felisa Hiteshew
*Attorney, Agent, or Firm*—Fitzpatrick, Cella, Harper & Scinto

[57] ABSTRACT

A process for fabricating a SOI substrate efficiently removes a non-porous Si region on a porous Si region, and solves the problem of etching of glass substrates and the problem that a relatively thick porous Si region is necessary. The process for fabricating a SOI substrate comprises a step of making a surface layer of a single-crystal Si substrate porous to form a porous single-crystal Si region on a first non-porous single-crystal Si region; a step of forming a second non-porous single-crystal Si region over a surface of the porous single-crystal Si region; a step of bonding a support substrate through an insulating region to a surface of the second non-porous single-crystal Si region; a step of removing the first non-porous single-crystal Si region; and a step of removing the porous single-crystal Si region, wherein the step of removing the first non-porous single-crystal Si region comprises a step of performing dry etching in which an etch rate of non-porous single-crystal Si region is greater than that of porous single-crystal Si region.

16 Claims, 5 Drawing Sheets

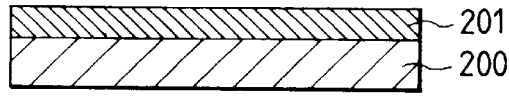
FIG. 2A
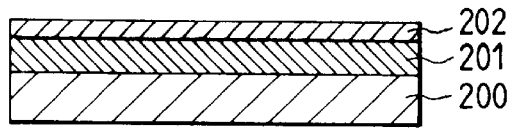
FIG. 2B
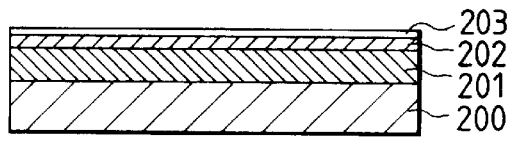
FIG. 2C
FIG. 2D
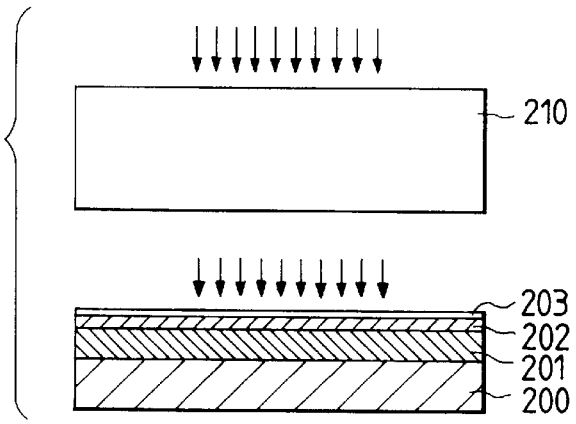
FIG. 2E
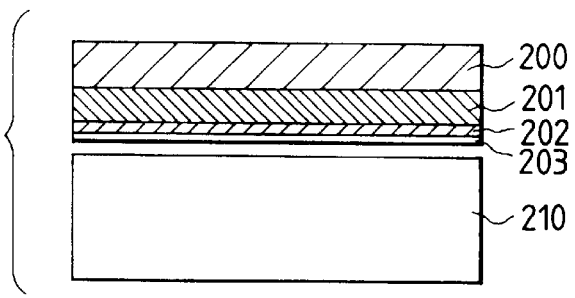
FIG. 2F
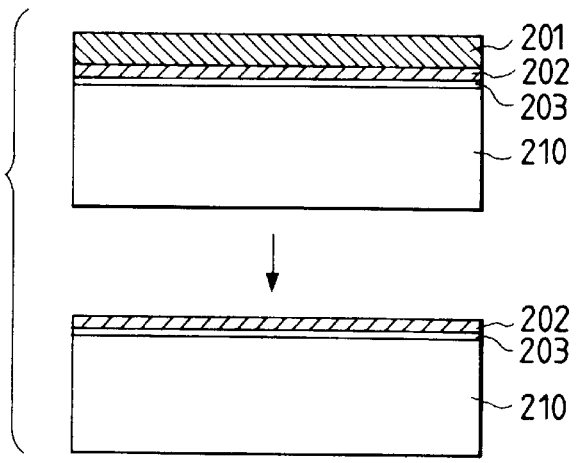

FABRICATION PROCESS FOR A SOI SUBSTRATE

BACKGROUND OF THE INVENTION

1. Field of the Invention

The present invention relates to a process for fabricating a SOI substrate with excellent film thickness uniformity and suppression of the formation of film vacancies (or voids) and interface states. More particularly, this invention relates to a fabrication process for a SOI substrate which can be applied to high-functionality and high-performance electronic devices, highly integrated circuits, and so on, which are fabricated in a single-crystal semiconductor layer on a transparent insulator substrate of glass or the like or on a silicon substrate with an oxide film thereon.

2. Related Background Art

Formation of a single-crystal silicon semiconductor layer on an insulator is widely known as the Silicon on Insulator (SOI) technology, and much research has been conducted because this substrate has a lot of advantages that cannot be achieved by bulk silicon substrates which are used for fabricating ordinary silicon integrated circuits.

[SOS and SIMOX]

One of the conventional SOI technologies is the so-called SOS (Silicon-On-Sapphire), which is a method for heteroepitaxially growing a silicon layer on a sapphire crystal, but the quality of the hetero-epitaxially grown silicon crystal is poor. Also, SIMOX (Separation-by-IMplanted-OXygen) is under practical use as a SOI forming technology for implanting a lot of oxygen ions into silicon and thereafter subjecting the resultant product to annealing, thereby forming an $SiO_2$ layer with implanted oxygen being buried from the surface of silicon to the position of about 0.2 $\mu$m. However, this implantation of many oxygen ions and annealing requires a lot of time, which is disadvantageous with respect to productivity and cost. The ion implantation also causes many crystal defects in the SOI silicon layer. Decreasing implantation of oxygen ions would make it difficult to maintain the film quality of the oxide layer. It is also considered to be difficult to change the thickness of the implanted $SiO_2$ film layer.

[Bonding SOI]

Among the SOI forming techniques reported recently, there is "bonding SOI," with particularly excellent quality. This is the technology in which mirror surfaces of two wafers, at least one of which has an insulating film formed by oxidation or the like, are brought into close adhesion with each other. They are then subjected to annealing so as to reinforce the coupling of the adhesion interface. Thereafter the substrate is polished or etched from either side so as to leave a silicon single-crystal thin film having an arbitrary thickness on the insulator film. The most important point in this technology is a step for reducing the silicon substrate into a thin film. In more detail, normally, the silicon substrate, which is as thick as several hundred $\mu$m or so, needs to be polished or etched uniformly down to the thickness of several $\mu$m or even 1 $\mu$m or less, which is technologically very difficult with respect to controllability and uniformity. There are roughly two ways for reducing silicon into a thin film. One of them is a method for carrying out thinning only by polishing (BPSOI: Bonding and Polishing SOI), and the other is a method for providing an etching stop layer immediately over a thin film to be left (actually, immediately under the thin film during fabrication of single substrate) and performing two stages of substrate etching and etching of the etching stop layer (BESOI: Bond and Etchback SOI). Since in the BESOI, a silicon active layer is often epitaxially grown over the preliminarily formed etching stop layer, this BESOI is considered to be advantageous to secure uniformity of film thickness. However, since the etching stop layer often contains a high concentration of impurities, it causes distortion of the crystal lattice, which causes the crystal defects to propagate to the epitaxial layer. There is also a possibility that the impurities diffuse upon oxidation of the epitaxial layer or upon annealing after bonding, thereby changing etching characteristics.

In these bonding SOIs, if there are contaminations in the bonding surfaces, or if there are asperities because the bonding surfaces are not flat enough, many vacant spaces called "voids" will appear at the bonding interface. From this view point, the BESOI discussed above is disadvantageous in many cases. The reason is as follows. The etching stop layer is normally formed, for example, by hetero-epitaxial growth by CVD or by epitaxial growth with doping of a high concentration of impurities. In the case of CVD, especially in the case of the hetero-epitaxial growth, the flatness achieved is often inferior to that of flat surfaces obtained by polishing. The etching stop layer is sometimes formed by ion implantation, but flatness is also degraded in this case.

[New BESOI technology]

An example of the technology for achieving good flatness of the bonding surfaces, uniform film thickness of the active layer as in the BESOI, and selectivity of etchback several orders of magnitude higher than that in the conventional BESOI is the technology for making the surface of silicon substrate porous by anodization, and epitaxially growing the silicon active layer thereon (Japanese Patent Application Laid-open No. 5-21338). In this case, the porous layer corresponds to the etching stop layer in the BESOI. However, since the etch rate of porous silicon is very high with a hydrofluoric acid based etchant as compared with single-crystal silicon, a high-selectivity etching characteristic is considered to be more important than the etching stop layer. Since this technology forms the porous silicon layer not by CVD, but by anodization of a flat single-crystal silicon substrate surface, the flatness of the epitaxially grown active layer is better than that formed in the BESOI in which the etching stop layer is formed by CVD or the like. The epitaxial layer growing on this surface achieves crystallinity nearly equal to that of an epitaxial layer grown on a non-porous single-crystal substrate. This enables us to use a single-crystal thin film equivalent to the epitaxial layer on the single-crystal silicon substrate with high reliability as an active layer, thus providing the SOI substrates with excellent crystallinity and with excellent film thickness uniformity.

K. Sakaguchi et al. reported that a substrate obtained by anodizing the surface of silicon single-crystal substrate to make it porous and effecting epitaxial growth thereon was bonded to a silicon substrate with an oxidized surface, the non-porous single-crystal silicon substrate portion was ground by a grinder to expose the porous layer, and only the porous layer was selectively etched with solution of $HF/H_2O_2$ mixture, thus achieving 507 nm±15 nm (±3%) or 96.8 nm±4.5 nm (±4.7%) as a film thickness distribution of SOI silicon layer for 5-inch wafers. It is described that in the etching with the solution of $HF/H_2O_2$ mixture in this case, the etching rate of the porous silicon layer is $10^5$ times greater than that of the non-porous silicon layer, and thus, the porous silicon layer functions well as an etching stop layer in the BESOI.

In addition to the method for bonding a single-crystal silicon substrate having a thermally oxidized surface or a transparent silica glass substrate to an epitaxial silicon film grown on this porous silicon, it is also possible to bond $SiO_2$ surfaces of two substrates to each other. The interface state density of the interface between the epitaxial silicon film as an active layer and $SiO_2$ (the thermally oxidized film of the epitaxial layer) is sufficiently low, and the thickness of the $SiO_2$ layer can be controlled arbitrarily. Thus, the substrate can be fabricated as making full use of the characteristics of SOI. Then the surface of $SiO_2$ at the bonding interface is activated by a plasma process, whereby the bonding strength can be enhanced and occurrence of voids can be suppressed.

The new BESOI technology described above permits us to obtain high-quality SOI substrates in which by the high selective etching of porous silicon layer the film thickness distribution preserves the flatness and film thickness distribution upon epitaxial growth. However, the above new BESOI technology has the following problems in removing the non-porous single-crystal Si region that was not made porous:

1. Problems raised by use of hydrofluoric acid based etchant of wet type.

The technology involves liquid exchange upon processing of many substrates it is difficult to control liquid concentration management. This causes poor productivity.

The $SiO_2$ layer and $SiO_2$ glass substrate are etched by the hydrofluoric acid based etchant because of the large etch rates thereof. Especially, in the case of bonding onto a transparent $SiO_2$ glass substrate, the back face of the glass substrate is also etched, which degrades the transparency of the transparent substrate.

In the case of exposing the porous silicon portion with a wet-type etchant such as a hydrofluoric acid/nitric acid based etchant or alkali solution as a method for removing the non-porous single-crystal Si region, the etch rate of the low-density porous silicon layer is greater than that of non-porous silicon no matter what etchant is used. Because of this, before removing all of the non-porous silicon portion, etching will proceed faster in portions where porous silicon is exposed, so that variations of the remaining film thicknesses of porous silicon will become very large, several $\mu$m or more. When the film thicknesses of porous silicon become as thin as several $\mu$m or less, etching reaches even the underlying epitaxial silicon layer under the porous silicon, which degrades the uniformity of the film thickness of the final SOI layer. Therefore, the thickness of the porous silicon layer needs to be 10 or more $\mu$m, and the porous silicon layer cannot be thinner than it.

2. Problem as to film thickness of the porous silicon layer:

In the case of grinding by a grinder as a method for removing the non-porous single-crystal Si region, a thickness of not less than 10 $\mu$m is necessary as a grinding margin to stop grinding at the underlying porous silicon layer as well as a damage layer due to grinding, and therefore, the porous silicon layer cannot be made thinner than it.

Therefore, a lot of time is necessary for formation and etching of the porous silicon.

SUMMARY OF THE INVENTION

It is, therefore, an object of the present invention to realize a process for fabricating a SOI substrate solving all these problems, i.e., the problems of reduced productivity and degradation of the transparency of transparent substrate with use of the wet type hydrofluoric acid based etchant for removing the non-porous single-crystal Si region, and the problem of requiring a lot of time for formation and etching of porous silicon because the grinder cannot be used to reduce the porous silicon layer.

In order to achieve the above objects, the present inventor has made all possible efforts to achieve the following invention. Namely, the fabrication process for a SOI substrate according to the present invention is a fabrication process comprising a step of making a surface layer of a single-crystal Si substrate porous to form a porous single-crystal Si region on a first non-porous single-crystal Si region; a step of forming a second non-porous single-crystal Si region over a surface of said porous single-crystal Si region; a step of preparing a support substrate, at least a surface layer of which is an insulating region, and bonding said insulating region to said second non-porous single-crystal Si region; a step of removing said first non-porous single-crystal Si region; and a step of removing said porous single-crystal Si region, wherein said step of removing said first non-porous single-crystal Si region comprises a step of performing dry etching in which an etch rate of the non-porous single-crystal Si region is greater than that of the porous single-crystal Si region.

Here, the step of removing the first non-porous single-crystal Si region preferably has a step of partly grinding the region by a grinder before the step of performing dry etching. The dry etching is preferably performed in such a way that activated ion species are made by ionization by electric or optical energy, the activated ion species are accelerated in the direction normal to the substrate surface, and the reaction takes place at the substrate surface. Determination of an end point of etching, where the porous single-crystal Si region is exposed over the entire surface by the dry etching, may be preferably made by setting a parallel plate electrode on the substrate and observing a change of a self-bias between the parallel plate electrode and the substrate.

Here, the step of removing the porous single-crystal Si region may be carried out by wet etching in which the etch rate of the porous single-crystal Si region is greater than that of the non-porous single-crystal Si region or by dry etching in which the etch rate of the porous single-crystal Si region is greater than that of the non-porous single-crystal Si region. The dry etching in which the etch rate of the porous single-crystal Si region is greater than that of the non-porous single-crystal Si region is preferably carried out in such a way that activated radicals resulting from decomposition by at least electric or optical energy intrude into the pores of the porous region to etch the region from inside.

The step of forming the second non-porous single-crystal Si region on the surface of the porous single-crystal Si region is preferably a step of epitaxially growing the second non-porous single-crystal Si region over the surface of the porous single-crystal Si region. Alternatively, the step may be a step of performing annealing to close the pores in the surface of the porous single-crystal Si region. Further, the support substrate may be a Si wafer, a Si wafer with an insulating surface, or an insulating substrate such as silica glass. In the case of the support substrate being a Si wafer, the surface of the second non-porous single-crystal Si region is made insulative.

The present inventor found the etching conditions having such opposite selectivity to that of wet etching, that in performing dry etching under certain conditions the etch rate of porous silicon is several or more times slower than that of non-porous silicon. The present invention is the one using the dry etching of such conditions for removing the non-porous single-crystal region. The mechanism of etching in which the etch rate of non-porous Si is faster than that of porous Si is not clarified completely yet, but may be considered as follows.

For the selective etching of the non-porous Si region herein, the etch rate of the surface is equal to or higher than the rate of intrusion of radicals or the like. For example, etching of the surface can be advanced more by using the reactive ion etching mode with anisotropy in the direction of the electric field, such as RIE (reactive ion etching), herein. In addition, because the surface of porous silicon is oxidized or because the density thereof is low, the DC electric field component of porous silicon in the ion etching mode is different from that of non-porous silicon, whereby the etch rate of porous silicon is conceivably lowered. In order to promote the surface etching in this ion etching mode, a method for applying a DC bias from the outside is effective in addition to increasing the self-bias by properly selecting the pressure, power, etching gas, etc. in RF plasma discharge. Application of 100 to several 100 V makes the etch rate of porous silicon about several to several ten times slower than that of non-porous silicon. This results in partially exposing underlying porous Si because of the thickness distribution of the wafer and the etching thickness distribution, when removing the non-porous wafer portion after bonding, but because the etch rate of that portion is slow, a distribution of remaining thicknesses of porous Si is relaxed, thus improving uniformity.

Since the selectivity of etch rate and the uniformity of in-plane distribution of etch rate are sufficiently high, time control is enough to determine the end point of etching at the time when the non-porous Si substrate portion is etched to expose the porous silicon portion throughout the entire surface. However, an apparatus, designed as taking account of productivity, can be arranged to monitor the self-bias in order to determine the end point. Namely, the end point can be determined because the self-bias is lowered at the time of exposure of porous silicon.

Since the present invention involves removing the non-porous single-crystal Si region with the conventional wet type hydrofluoric acid based etchant or alkali based etchant, it has solved the problems of very poor productivity due to liquid exchange after processing of many substrates and the difficulty in controlling liquid concentration management. In addition, etching of transparent $SiO_2$ glass substrate with the hydrofluoric acid based etchant does not occur in the dry etching, which solves, the problem of degradation of the transparency of transparent substrate.

It was difficult to stop etching at the porous silicon portion in the case of grinding by a grinder or etching with the hydrofluoric acid based etchant, which has been used heretofore as a method for removing the non-porous silicon wafer portion, and the film thickness of porous silicon was as thick as 10 or more $\mu$m to keep a margin. However, the selective etching in which the etch rate of non-porous silicon wafer portion is greater than that of porous silicon layer obviates the need to keep the margin, so that the porous silicon can be made as thin as 5 to 10 $\mu$m. This reduces the time for anodization for forming porous silicon and the etching time to etch porous silicon both to the half of those heretofore, thus improving productivity.

BRIEF DESCRIPTION OF THE DRAWINGS

FIGS. 2A, 2B, 2C, 2D, 2E and 2F are schematic cross-sectional views for explaining steps in the third example of the present invention;

DETAILED DESCRIPTION OF THE PREFERRED EMBODIMENTS

An embodiment of the present invention will be explained with reference to FIGS. 1A to 1E.

Figure 1A:
FIGS. 1A, 1B, 1C, 1D and 1E are schematic cross-sectional views for explaining an embodiment of the present invention and steps in the first and second examples.
Figure 1B:
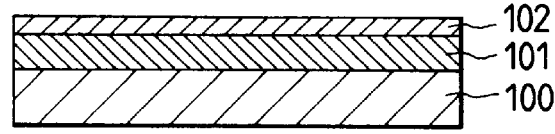
Figure 1C:
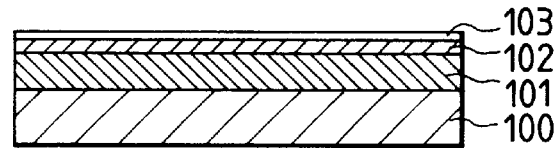
Figure 1D:
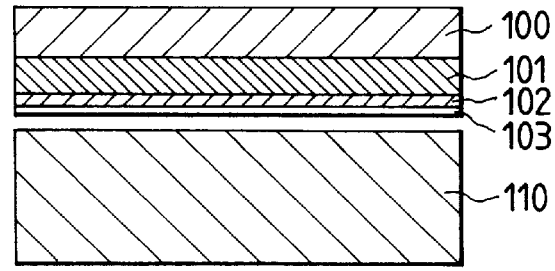
Figure 1E:
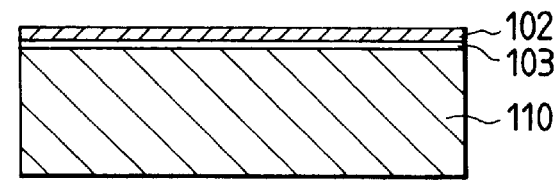
Figure 3A:
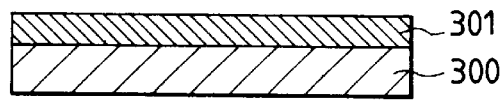
FIGS. 3A, 3B, 3C, 3D, 3E and 3F are schematic cross-sectional views for explaining steps in the fourth example of the present invention.
Figure 3B:
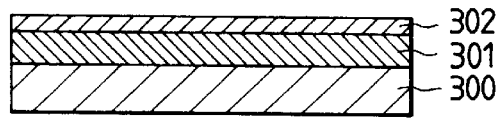
Figure 3C:
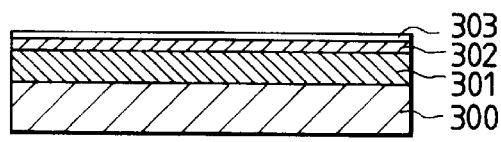
Figure 3D:
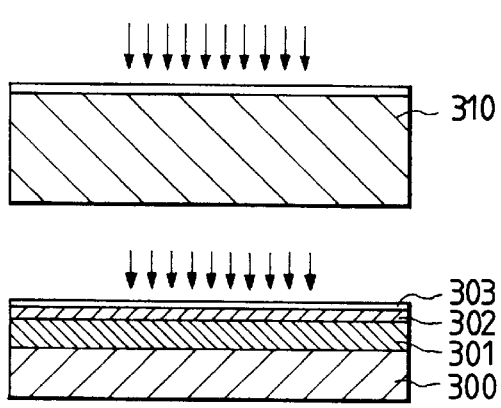
Figure 3E:
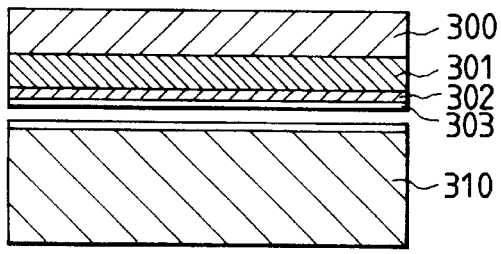
Figure 3F:
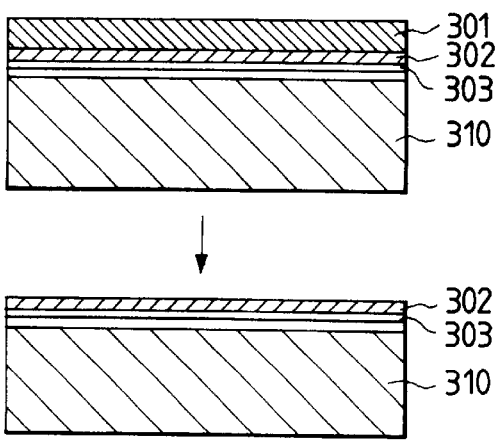
Figure 4A:
FIGS. 4A, 4B, 4C, 4D, 4E and 4F are schematic cross-sectional views for explaining steps in the fifth example of the present invention.
Figure 4B:
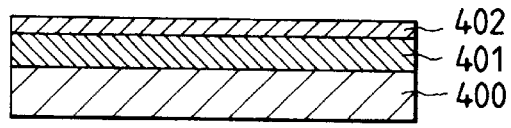
Figure 4C:
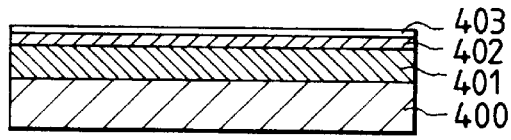
Figure 4D:
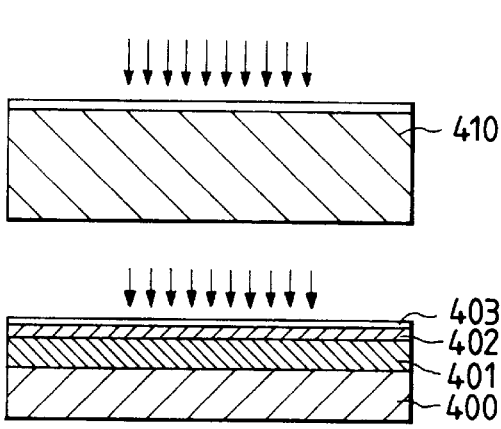
Figure 4E:
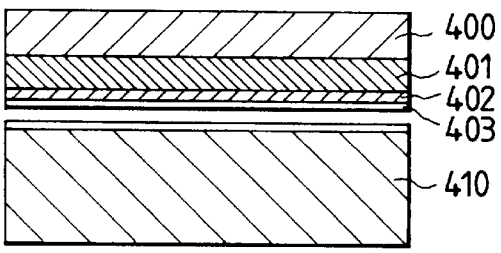
Figure 4F:
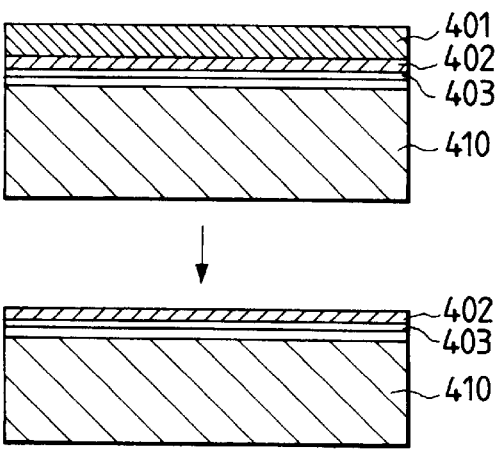
Figure 5A:
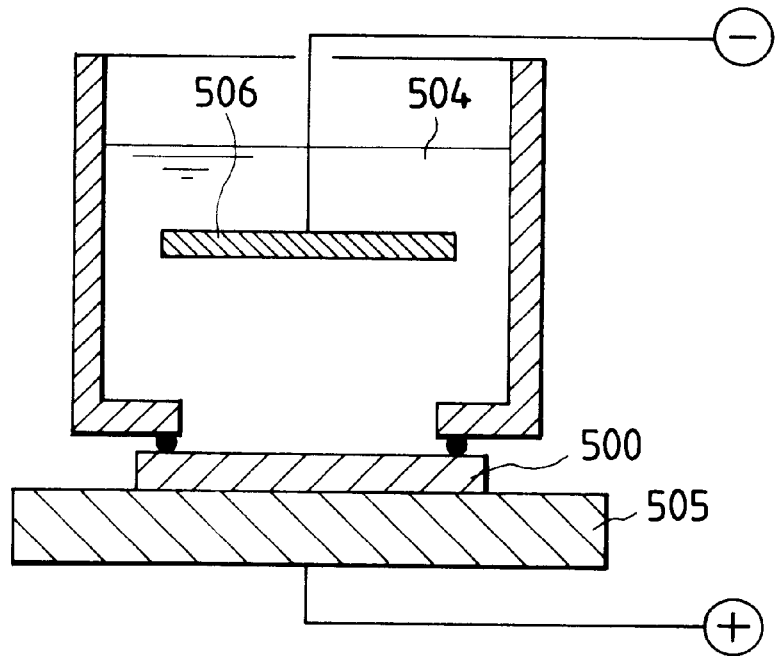
FIGS. 5A and 5B are schematic cross-sectional views of apparatus for making a silicon substrate porous.
Figure 5B:
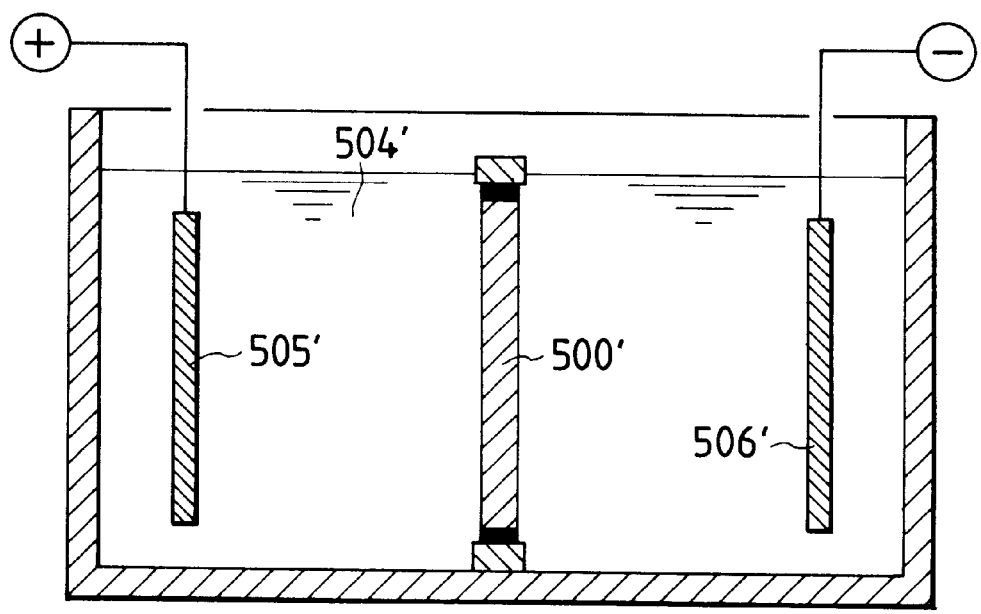

(FIG. 1A) A single-crystal silicon substrate 100 is anodized to form porous silicon 101. The thickness of the porous layer at this time may be between several $\mu$m and several tens of $\mu$m of the one-side surface layer of substrate. The method for forming porous silicon will be explained referring to FIGS. 5A and 5B. First, a p-type single-crystal silicon substrate 500 is prepared as a substrate. N-type is not impossible, but it is limited to low-resistance substrates, or anodization must be carried out in such a state that generation of holes is promoted by irradiating the surface of the substrate with light. The substrate 500 is set in the apparatus as shown in FIG. 5A. Namely, one side of the surface is in contact with hydrofluoric acid based solution 504, a negative electrode 506 is set on the solution side, and the other side of the substrate is in contact with a positive metal electrode 505. As shown in FIG. 5B, positive electrode side 505' may be also arranged at a potential through solution 504'.

In either case, formation of porous layer starts from the negative electrode side in contact with the hydrofluoric acid based solution. The hydrofluoric acid based solution 504 is normally conc. hydrofluoric acid (49% HF). As the hydrofluoric acid solution is diluted with pure water ($H_2O$), etching starts from a certain concentration, though depending upon a value of current flowing, which is not preferred. In some cases bubbles occur from the surface of the substrate 500 during anodization, and alcohol is thus added as a surfactant to remove the bubbles efficiently. Alcohols applicable are methanol, ethanol, propanol, isopropanol, and the like. Using a stirrer instead of the surfactant, anodization may be carried out with stirring.

The negative electrode 506 is made of a material that is not corroded by the hydrofluoric acid solution, for example, gold (Au), platinum (Pt), and the like. A material for the positive electrode 505 may be selected from normally used metal materials, but, because the hydrofluoric acid based solution 504 will reach the positive electrode 505 after completion of anodization of the entire substrate 500, the surface of the positive electrode 505 should better be coated with a metal film resistant to the hydrofluoric acid solution. The value of the current for anodization may be selected in the range of the maximum of several hundred $mA/cm^2$ to the minimum of more than zero. This value is determined within the range that permits good-quality epitaxial growth on the surface of porous silicon. Normally, with increasing the current value, the rate of anodization increases and the density of the porous silicon layer decreases. Namely, the volume occupied by pores increases. This changes the conditions of epitaxial growth.

(FIG. 1B) A non-porous single-crystal silicon layer 102 is epitaxially grown over the porous layer 101 formed as described above. The epitaxial growth is carried out by ordinary thermal CVD, low pressure CVD, plasma CVD, molecular beam epitaxy, sputtering, or the like. The film thickness of the thus grown layer may be determined to be the same as a design value of the SOI layer, but the film thickness is preferably not more than 2 $\mu$m. The reason is as follows. If a single-crystal Si film 2 or more um thick exists on the insulating substrate mainly containing $SiO_2$, great stress will occur at the bonding interface upon annealing thereof in device processes because of a difference of thermal expansion coefficients between the two materials. This will cause breakdown of the silicon film, curvature of the substrate, peeling-off at the interface, or the like. Since the stress is relatively small with the film thickness being not more than 2 μm, breakdown of film, peeling-off, curvature, etc. are unlikely to occur. More preferably, the film thickness is not more than 0.5 μm. This is because with film thicknesses of not less than 0.5 μm, slip lines become likely to occur on the crystal in fine regions, though peeling-off, breakdown, etc. will not occur, upon annealing in the subsequent processes.

The non-porous single-crystal Si layer 102 may be formed by closing the pores in the surface of the porous Si layer 101 by annealing.

(FIG. 1C) The surface of the epitaxial layer 102 is oxidized (103). This is necessary because, in case of the epitaxial layer being bonded directly to a support substrate in the next step, impurities would segregate easily at the bonding interface and non-coupling bonds (dangling bonds) of atoms at the interface would increase, which would make characteristics of thin film devices unstable.

The sufficient thickness of the oxide film may be determined within such a range as not to be affected by contaminations taken from the atmosphere into the bonding interface.

(FIG. 1D) Prepared are the above substrate 100 having the epitaxial surface with the oxidized surface and the support substrate 110. Specific examples of the support substrate 110 include a silicon substrate the surface of which is oxidized, silica glass, crystallized glass, $SiO_2$ deposited on an arbitrary substrate, and so on.

When two surfaces to be bonded to each other are both $SiO_2$, then these two substrates, or one of them is exposed to a plasma ambience to activate $SiO_2$ in the surface. Gas used at this time is preferably oxygen, but in addition thereto, possibly applicable gases are the air (mixture of oxygen and nitrogen), nitrogen, hydrogen, inert gas such as argon or helium, gas of molecules of ammonia or the like, and so on.

When the surface consisting of Si is bonded to the surface consisting of $SiO_2$, such a treatment as mentioned above is not necessary.

The two substrates prepared in the above step are cleaned and thereafter bonded to each other. A preferable cleaning method is just rinsing with pure water, and examples of other solutions applicable include a solution of hydrogen peroxide diluted with pure water, and a solution of hydrochloric acid or sulfuric acid diluted with sufficient pure water.

Pressing the entire surfaces of the substrates after bonding enhances the strength of the junction.

Then the bonded substrates are annealed. The annealing temperature is preferably as high as possible, but too high temperatures would cause structural change of the porous layer 101, or diffusion of impurities contained in the substrate into the epitaxial layer. It is, therefore, necessary to select the temperature and time to avoid this. Specifically, preferable temperatures are not more than 1200° C. Further, some substrates are not resistant to annealing at high temperatures. For example, in the case of the support substrate 110 being silica glass, annealing must be conducted at temperatures of not more than approximately 200° C. because of the difference of thermal expansion coefficients between silicon and silica. At temperatures above it, the bonded substrates will be peeled off or broken because of stress. It is, however, noted that annealing is sufficient as long as the interface can resist grinding of bulk silicon 100 and stress upon etching in the next step. Therefore, the process can be performed even at temperatures of not more than 200° C. by optimizing the surface treatment conditions for activation.

(FIG. 1E) Next, the silicon substrate portion 100 and porous portion 101 are selectively removed to leave the epitaxial layer 102.

First, the non-porous silicon substrate portion 100 is partly ground by a surface grinder or the like and thereafter is etched by RIE, or the entire silicon substrate portion 100 is removed by RIE without grinding. When the Si substrate portion 100 is partially removed by grinding, the Si substrate portion on the porous Si region 101 is left preferably in the thickness range of 2 to 300 μm, more preferably in the thickness range of 5 to 100 μm.

As for the etching of the non-porous silicon substrate portion herein, the point of the present invention is that the etch rate of the surface is equal to or greater than the intrusion rate of radicals or the like. Therefore, using the reactive ion etching mode having anisotropy in the direction of the electric field, such as RIE, etching of the surface can be advanced more. Further, because the surface of porous silicon is oxidized, or because the density thereof is small, the DC electric field component in the ion etching mode varies between non-porous and porous silicon, whereby the etch rate of porous silicon is lowered.

In order to promote the surface etching in this ion etching mode, it is necessary to properly select the pressure, power, etching gas, and so on in RF plasma discharge. The reactive ion etching is carried out in such a way that etching gas, such as $H_2$ gas, or $CF_4$ or $SF_6$ containing F atoms, is mixed with carrier gas such as $O_2$ or $N_2$ gas or inert gas such as He or Ar, it is decomposed by a plasma obtained by RF or microwave power or by energy of light, and activated ions reach the surface of the etched substrate as accelerated in the direction of the electric field, thus etching the surface.

In setting discharge conditions, it is important to facilitate achievement of ionization energy, especially, by setting the discharge pressure low to ensure a long mean free path of gas molecules. Greater RF power will increase the DC bias component between the electrodes to promote ion etching, but on the other hand, it also promotes the radical decomposition reaction, so that the radical etching mode is also mixed. Therefore, care is needed. In addition to increasing the self-bias by RF power, a method for applying a DC bias from the outside is also effective. Application of 100 to several 100 V enhances the etch rate of non-porous silicon, and even etching of several 100 μm will be completed within several hours. The etch rate of porous silicon at that time is approximately several to several ten times slower. Therefore, in removing the non-porous wafer portion after bonding, underlying porous silicon is partially exposed because of the thickness distribution of the wafer and the etching thickness distribution, but because the etch rate of that portion is slow, the distribution of thicknesses of remaining porous silicon is relaxed, thus improving uniformity. A plasma utilizing magnetron or ECR plasma is also effective for further promoting the ion etching.

As described above, when the porous portion 101 is exposed after etching the non-porous silicon substrate portion 100, etching is stopped once. Determination of the end point of etching at this time may be made by time control because of the sufficient selectivity of etch rate and sufficient in-plane distribution uniformity of the etch rate, but it can also be made by monitoring the self-bias. Namely, the determination of the end point can be made accurately because the self-bias drops when the porous silicon is exposed.

Next, the underlying porous region 101 is removed by wet etching. Removal of the porous single-crystal Si region is carried out with an ordinary etchant for Si, or with a selective etchant for porous Si, to expose the non-porous region 102. Specific examples of the selective etchant include hydrofluoric acid, mixtures of hydrofluoric acid with at least either one of alcohol and hydrogen peroxide, buffered hydrofluoric acid, and mixtures of buffered hydrofluoric acid with at least either one of alcohol and hydrogen peroxide. Ordinary etchants for Si can also selectively etch only porous Si because of the huge surface area of porous Si.

Since an etchant of low-concentration hydrofluoric acid can be used for wet etching porous region 101, the phenomenon of dissolving $SiO_2$ is negligible.

The underlying porous portion 101 can also be removed by radical dry etching. In porous silicon there are several-ten-to-hundred-angstrom pores in high density from the surface to the inside, and the radicals intruding into the pores and involved in etching adhere to the walls of the pores to start etching from the side walls and to thin out pillars in the pillar structure, whereby the porous silicon portion finally disintegrates and is removed. On the other hand, non-porous silicon has no pores, and thus, only etching of its surface occurs. For example, supposing that the radicals involved in etching intruded up to the depth of several ten $\mu$m and attached to the pores of porous silicon during several-ten-angstrom etching of the non-porous surface, the walls of the pores would also be etched by the same quantities as the surface, so that the pillars in the portions where the radicals intruded through the pores would disintegrate, thus effecting several-ten-$\mu$m etching of porous silicon.

The important point herein is that the rates at which the radicals involved in etching intrude and attach to the pores of porous silicon are sufficiently greater than the etch rate of the surface. Accordingly, the point of the present invention herein is that the etching to remove porous silicon is in the chemical, radical etching mode in which etching is effected only by diffusion of the radicals involved in etching into the pores and etching proceeds isotropically. Since reactive ion etching having anisotropy in the direction of the electric field, such as ordinary RIE, advances etching of the surface more, it is not used as the etching method herein. It is, however, noted that the etching herein can be realized even in an etching apparatus for RIE by selecting appropriate conditions for gas, flow rate, pressure, and so on. The discharge conditions need to be set, especially, so as to keep the discharge pressure high to make the mean free path of gas molecules short and thereby promote the second-order reaction of ions, and to keep the self-bias of the substrate low to eliminate etching of the surface by activated ions. It is also effective to employ a method for applying a DC bias from the outside in the reverse direction to the self-bias or a method for positioning the etched substrate on the anode side of electrode, but it is difficult to suppress arrival of ions completely. Preferably, a radical generating section and an etching section are spatially separated from each other and a process to transport the radicals between them is provided.

Also, as the etching gas such as $H_2$ gas, or $CF_4$ or $SF_6$ containing F atoms, is mixed with the carrier gas such as $O_2$ or $N_2$ gas, it is decomposed into radicals by a plasma formed by RF or microwave power or by energy of light, and the second-order reaction with the carrier gas or the like takes place in the vapor phase in the transport process, thereby obtaining more stable and longer-lived etching radicals. This is because the etching gas arrives on the non-etched substrate. Further, when the substrate is heated or vibrated upon etching, it promotes isotropic diffusion of the radicals to stabler sites, so that intrusion thereof into the pores of porous silicon is promoted, whereby the etch rate of porous silicon is attained at the selectivity $10^5$ to $10^6$ times greater than that of non-porous silicon. At this time, since the underlying epitaxial portion 102 is non-porous, the etch rate thereof is five to six orders of magnitude smaller than the etch rate of porous silicon, and etching rarely occurs, whereby the epitaxial layer 102 remains as a thin film and preserves the film thickness uniformity achieved upon epitaxial growth.

Further, the following steps may be added in some cases to the steps as described above.

(1) Oxidation of inner walls of pores in the porous layer (preoxidation)

The thicknesses of the walls between the adjacent pores in the porous Si layer are very small, several nm to several tens of nm. This will sometimes cause the pore walls to cohere to each other during a high-temperature processing of the porous layer, for example, upon formation of the epitaxial Si layer, upon annealing after bonding, or the like, and the pore walls become large and coarse so as to close the pores, thus lowering the etch rate. If a thin oxide film is formed on the pore walls after formation of the porous layer, the pore walls will be prevented from becoming large and coarse. However, since the non-porous single-crystal Si layer needs to be epitaxially grown on the porous layer, it is necessary to oxidize only the surfaces of the inner walls of the pores so as to leave single crystallinity inside the pore walls of the porous layer. The oxide films formed herein desirably have film thicknesses of several Å to several tens of Å. The oxide films of such film thicknesses are formed by annealing at a temperature in the range of 200° C. to 700° C., more preferably at a temperature in the range of 250° C. to 500° C., in an oxygen ambience.

(2) Hydrogen baking process

EP553852A2 showed that annealing under a hydrogen ambience could remove fine roughness of Si surface so as to obtain a very smooth Si surface. The baking under the hydrogen ambience can also be applied in the present invention. The hydrogen baking can be carried out, for example, after formation of the porous Si layer and before formation of the epitaxial Si layer. Separately from it, the hydrogen baking can be effected on the SOI substrate obtained after etching removal of the porous Si layer. The hydrogen baking process carried out before formation of the epitaxial Si layer causes a phenomenon that the outermost surfaces of the pores are blocked by migration of Si atoms constituting the porous Si surface. When the epitaxial Si layer is formed as the outermost surfaces of the pores are blocked, the epitaxial Si layer is obtained with fewer crystal defects. On the other hand, the hydrogen baking carried out after etching of the porous Si layer to smooths the epitaxial Si surface which was roughened more or less by etching. Hydrogen baking also facilitates outward diffusion of boron having been taken from the air in the clean room into the bonding interface upon bonding and having diffused into the epitaxial Si layer as well as boron having thermally diffused from the porous Si layer to the epitaxial Si layer, so as to drive such boron out.

Execution of the above steps permit us to obtain the SOI substrate with a good film thickness distribution on the transparent insulating substrate with a single silicon crystal formed therein.

In a possible modification of the fabrication process for a SOI substrate as described above, the surface of the non-porous single-crystal Si region 102 epitaxially grown is bonded to the Si wafer 110 having an oxide film without forming the oxide film 103 on the surface of the region 102. In another possible modification, the oxide film is formed on the surface of the non-porous single-crystal Si region 102 and it is bonded to the Si wafer 110 without an oxide film.

EXAMPLES

Example 1

The first example of the present invention will be explained in detail with reference to FIGS. 1A to 1E and FIGS. 5A and 5B.

(FIG. 1A) A 6-inch p-type (100) single-crystal silicon substrate (0.1 to 0.2 Ωcm) approximately 300 µm thick was prepared, it was set in the apparatus as shown in FIG. 5A, and anodization was carried out to convert only 10 µm of the surface of silicon substrate 100 to porous silicon 101. The solution 504 at this time was 49% HF solution, and the current density was 100 mA/cm$^2$. The porous layer forming rate at this time was 5 µm/min and the 10 µm thick porous layer was obtained after two minutes.

(FIG. 1B) The single-crystal silicon layer 102 was epitaxially grown 0.30 µm thick on the porous silicon 101 by CVD. The deposition conditions were as follows.

Gas used: $SiH_4/H_2$

Flow rate of gas: 0.62/140 (1/min)

Temperature: 750° C.

Pressure: 80 Torr

Rate of growth: 0.12 µm/min (FIG. 1C) The substrate prepared by the above method was processed at 900° C. in a steam ambience to obtain the oxide film 103 of 0.20 µm.

(FIG. 1D) The above substrate 100 having the oxide film, and a support substrate (a bare silicon wafer without a silicon dioxide film) 110 preliminarily prepared were cleaned, then spin-dried, and thereafter bonded to each other. In this case, though the adhesion strength was originally high because of bonding between the Si surface and the $SiO_2$ surface, but after bonding, annealing was further conducted at 1150° C. for five minutes, thereby further enhancing the adhesion strength.

(FIG. 1E) After annealing, the non-porous single crystal substrate 100 was selectively etched in a parallel plate plasma etching system, thereby exposing the porous silicon 101. The wafer bonded at this time had variation of thickness, and the porous silicon layer also had variation of thickness caused upon anodization, whereby the maximum variation of thickness of the non-porous single-crystal substrate portion 100 was approximately 300±5 µm. The etching conditions at this time were as follows.

RF frequency: 13.56 MHz

RF power: 1 kW

Flow rate of $SF_6$ gas: 1000 sccm

Flow rate of oxygen: 300 scam

Pressure: 20 Pa

Substrate bias: 500 V

Processing time: 63 minutes

The etch rate of non-porous silicon under the above conditions was 5 µm/min while that of porous silicon was 1 µm/min. If the non-porous single-crystal substrate portion 100 is as thin as about 295 µm in the worst case, it is overetched for three minutes; if it is as thick as 305 µm then it is overetched for one minute. The etching thicknesses of the underlying porous silicon 101 at this time are 4 µm and 2 µm, respectively, and thus, etching can be stopped in porous silicon 101 of 10 µm in the worst case. At this time no specific determination of end point was carried out, but for six substrates set in the etching system, the porous silicon layers of the all substrates were exposed over the entire surface in the processing time set, and in-wafer-plane distributions of remaining thicknesses thereof were within ±10%.

This substrate was then etched with the conventional $HF/H_2O_2$ solution to remove the porous portion by wet etching.

As a result, the SOI substrate was formed with an excellent ultra-thin single-crystal silicon film in the film thickness distribution of abut 180 nm±5.4 nm (±3%) on the silicon dioxide film of 0.2 µm.

Example 2

Example 2 has the same steps up to the step of removing the non-porous single-crystal Si region 100 as those in Example 1 (FIGS. 1A to 1E).

Then this substrate was set in a microwave-excited chemical dry etching system, and only the porous portion 101 was selectively etched. This system is spatially separated into a section for generating a plasma by microwave power and a section for carrying out etching, whereby the ion species will not reach the non-etched substrate. The etching conditions at this time were as follows.

Microwave frequency: 1 GHz

Microwave power: 100 W

Flow rate of $SF_6$ gas: 100 sccm

Flow rate of $O_2$: 500 sccm

Flow rate of $N_2$: 500 sccm

Pressure: 100 Pa

Processing time: 30 minutes

The etch rate of non-porous silicon under the above conditions was up to $5 \times 10^{-4}$ µm/min, approximately. However, since etching first proceeded inside the pores of porous silicon, etching of the surface was not observed. The porous silicon layer started disintegrating suddenly approximately 20 minutes after the start of etching, and was etched completely after 30 minutes from the start. Variation of remaining thicknesses of porous silicon was approximately 6 to 8 µm in the worst case. Supposing that overetching of the underlying epitaxial single-crystal silicon layer 102 were of even about ten minutes in the etching of 30 minutes, overetching of single-crystal silicon would be not more than 50 Å, which would not affect the uniformity achieved upon epitaxial growth. The end point of etching can be determined utilizing a method for monitoring fluorescence from the etched surface, but control of etching time is sufficient because of the very large selectivity.

As a result, the SOI substrate was obtained with an excellent ultra-thin single-crystal silicon film having the film thickness distribution of about 180 nm ±5.4 (±3%) on the silicon dioxide film of 0.6 µm.

Example 3

The third example of the present invention will be explained in detail with reference to FIGS. 2A to 2F.

(FIG. 2A) A 6-inch p-type (100) silicon substrate 200 with resistivity of 0.01 Ω·cm of 300 µm thick was prepared, and only 10 μm of the surface layer thereof was converted into porous silicon 201 in the same manner as in the first example.

(FIG. 2B) A 0.15 μm thick epitaxial layer 202 was formed in on the porous surface in the same manner as in the first example.

(FIG. 2C) The substrate prepared by the above method was oxidized by 0.1 μm (203) in a steam of 1000° C.

(FIG. 2D) Surfaces of the above substrate and a 6-inch synthetic silica substrate 210 preliminarily prepared were plasma-processed, wherein the above substrate 200 having the oxide film 203, and the support substrate (synthetic silica substrate) 210 preliminarily prepared were set in a parallel plate plasma processing system, and the surfaces of the respective substrates were subjected to an activation process by an oxygen plasma. The process conditions were as follows.

RF frequency: 13.56 MHz

RF power: 400 W

Flow rate of oxygen: 30 sccm

Pressure: 20 Pa

Processing time: 1 minute

Particular control of bias was not carried out between the plasma and the substrate, and the surface was processed only by the self-bias of the plasma.

(FIG. 2E) The above silicon substrate 200 and silica substrate 210 were immersed in pure water for five minutes, they were spin-dried thereafter, and then the processed surfaces thereof were bonded to each other. Subsequently, annealing was conducted at 300° C. for ten hours.

(FIG. 2F) First, the silicon substrate portion 200 having the thickness of 290 μm was etched by RIE under the same conditions as in Example 1. After the porous silicon layer 201 was exposed to the surface, the porous layer 201 was then selectively etched by the wet etching in the same manner as in Example 1. At this time the silica substrate 210 was not etched at all. The end point of etching can be determined utilizing the method for monitoring fluorescence from the etched surface, but control of etching time is sufficient because of the very large selectivity.

As a result, the SOI substrate was obtained with a silicon single-crystal thin film having the film thickness distribution of 98.2 nm±3.4 nm (±3.5%) on the silica substrate.

Example 4

The fourth example of the present invention will be explained in detail with reference to FIGS. 3A to 3F.

(FIG. 3A) A 300 μm thick, 5 inch p-type (100) silicon substrate 300 with resistivity of 0.01 Ω·cm was prepared, and a 5 μm thick porous layer 301 was formed from the surface thereof.

(FIG. 3B) A 0.15 μm thick epitaxial layer 302 was formed on the porous surface of the thus obtained substrate in the same manner as in the first example.

(FIG. 3C) The substrate prepared by the above method was processed at 900° C. in a steam ambience, thereby obtaining an oxide film 303 of 0.05 μm.

(FIG. 3D) The above substrate 300 having the oxide film, and a support substrate (silicon wafer) 310 with a silicon dioxide film 0.2 μm thick preliminarily prepared were set in the parallel plate plasma processing system, and the surfaces of the respective substrates were activated under the oxygen plasma conditions similar to those in Example 3.

(FIG. 3E) Both substrates thus surface-processed were immersed in pure water for five minutes, they were spin-dried, and then the processed surfaces thereof were bonded to each other. After that, annealing was carried out at 400° C. for six hours.

(FIG. 3F) After annealing, the side of silicon substrate 300 was selectively etched under the conditions below in the parallel plate plasma etching system, similar to that described above, thereby exposing porous silicon 301.

RF frequency: 13.56 MHz

RF power: 1 kW

Flow rate of $CF_4$ gas: 800 sccm

Flow rate of Ar gas: 200 sccm

Pressure: 5 Pa

Substrate bias: 500 V

Processing time: 99 minutes to 102 minutes

The etch rate of non-porous silicon under the above conditions was 3.1 μm/min while that of porous silicon was 0.43 μm/min. Similarly as in Example 1, there is the variation of 300 to 305 μm in the worst case for the non-porous single-crystal substrate portion 300, and, for example, in the case of etching of 100 minutes, porous silicon will be overetched for 1.6 to 4.8 minutes. The etching thicknesses of underlying porous silicon 301 at this time are 0.69 μm and 2.1 μm, respectively, and even in the worst case, etching of porous silicon 301 of 5 μm can be stopped as leaving the thicknesses of 2.9 to 4.3 μm. Determination of this end point was carried out by monitoring the self-bias, and as an end point of etching of porous silicon, discharge was stopped when the self-bias became 900 V to 700 V. For six substrates set in the etching system, porous silicon of all the substrates was exposed over the entire surface, and in-wafer-plane distributions of remaining thicknesses thereof were within ±10%.

This substrate was then set in the microwave-excited chemical dry etching system to selectively etch only the porous portion 301. The etching conditions at this time were almost the same as in Example 1, but the substrate was heated and also vibrated by ultrasonic waves.

Microwave frequency: 1 GHz

Microwave power: 100 W

Flow rate of $SF_6$ gas: 100 sccm

Flow rate of $O_2$: 500 sccm

Flow rate of $N_2$: 500 sccm

Pressure: 100 Pa

Substrate temperature: 300° C.

Ultrasonic wave: 1 kW

Processing time: 10 minutes

The etch rate of non-porous silicon under the above conditions was also approximately up to $5 \times 10^{-4}$ μm/min.

The effects of heating and ultrasonic vibration of substrate first promoted diffusion into the pores of the porous silicon, and also promoted physical disintegration due to etching of the walls of pores, thereby exposing almost all the underlying epitaxial layer after 7 to 8 minutes from the start, and completely etching the porous portion after 10 minutes. Even if this underlying epitaxial single-crystal silicon layer 302 were overetched for 10 minutes, the overetching thicknesses would be not more than 50 Å, which would not affect the uniformity achieved upon epitaxial growth. The end point of etching can be determined by utilizing the method for monitoring fluorescence from the etched surface, but control of the etching time is sufficient because of the very large selectivity.

As a result, the SOI substrate was obtained with an excellent ultra-thin single-crystal silicon film having the film thickness distribution of about 100.8 nm±3.4 (±3.4%) on the 0.25 μm thick silicon dioxide film.

Example 5

The fifth example of the present invention will be explained in detail with reference to FIGS. 4A to 4F.

(FIG. 4A) A 300 μm thick, 5 inch p-type (100) silicon substrate 400 with resistivity of 0.01 Ω·cm was prepared, and a 5 μm thick porous layer 401 was formed from the surface thereof.

(FIG. 4B) A 0.15 μm thick epitaxial layer 402 was formed on the porous surface of the substrate in the same manner as in the first example.

(FIG. 4C) The substrate prepared by the above method was processed at 900° C. in a steam ambience to obtain a 0.05 μm thick oxide film 403.

(FIG. 4D) The above substrate 400 having the oxide film, and a support substrate (silicon wafer) 410 with a silicon dioxide film 0.2 μm thick preliminarily prepared were set in the parallel plate plasma processing apparatus, and the surfaces of the respective substrates were activated under the oxygen plasma conditions similar to those in Example 3.

(FIG. 4E) Both substrates thus surface-processed were immersed in pure water for five minutes, they were then spin-dried, and thereafter their processed surfaces were bonded to each other. After that, annealing was carried out at 400° C. for six hours.

(FIG. 4F) After annealing, the side of silicon substrate 400 was selectively etched under the conditions of Example 3 in the parallel plate plasma etching apparatus similar to that described above, thereby exposing porous silicon 401. The etch rate of non-porous silicon under such conditions was 3.1 μm/min while that of porous silicon was 0.43 μm/min. Similarly as in Example 1, there is the variation of 300 to 305 μm in the worst case for the non-porous single-crystal substrate portion 400, and, for example, in the case of etching for 100 minutes, porous silicon will be overetched for 1.6 to 4.8 minutes. At this time, similarly as in Example 3, etching of porous silicon 401 of 5 μm can also be stopped as leaving the thicknesses of 2.9 to 4.3 μm even in the worst case. Determination of this end point was made by monitoring the self-bias, and as an end point of porous silicon etching, discharge was stopped when the self-bias became 900 V to 700 V.

This substrate was set in a light-excited $H_2$ radical generating system to selectively etch only the porous portion 401. Since the section for generating $H_2$ radicals is spatially separated from the section for carrying out etching and since no plasma is used in the case of light excitation, ion species do not reach the substrate. The etching conditions at this time were as follows.

Excitation light source: low pressure mercury lamp (253.7 eV)

Flow rate of $H_2$ gas: 100 sccm

Pressure: 10 Pa

Substrate temperature: 300° C.

Ultrasonic wave: 1 kW

Processing time: 30 minutes

In this optically decomposed $H_2$ radical etching under the above conditions, the etch rate of non-porous silicon was also approximately up to $2 \times 10^{-4}$ μm/min.

The effects of the heating and ultrasonic vibration of substrate first promoted diffusion into the pores of porous silicon and also promoted physical disintegration due to etching of the walls of pores, thereby exposing almost all the underlying epitaxial layer after 20 minutes from starting, and completely etching the porous portion after 30 minutes. Even if the underlying epitaxial single-crystal silicon layer 402 were overetched for 10 minutes, the overetching thicknesses would be not more than 50 Å, which would not affect the uniformity achieved upon epitaxial growth. The end point of etching can also be determined utilizing the method for monitoring fluorescence from the etched surface, but control of etching time is sufficient because of the very large selectivity.

As a result, the SOI substrate was obtained with an excellent ultra-thin single-crystal silicon film having the film thickness distribution of about 99.8 nm ±3.6 (±3.6%) on the 0.25 μm thick silicon dioxide film.

Example 6

The sixth example of the present invention will be explained in detail with reference to FIGS. 1A to 1E and FIGS. 5A and 5B.

(FIG. 1A) A 600 μm thick, 6-inch p-type (100) single crystal silicon substrate (0.1 to 0.2 Ω·cm) was prepared, and this was set in the apparatus as shown in FIG. 5A. Then anodization was effected to change only 10 μm of the surface of silicon substrate 100 into porous silicon 101. The solution 504 at this time was 49% HF solution, and the current density was 100 mA/cm². Further, the rate of formation of porous layer at this time was 5 μm/min and the 10 μm thick porous layer was obtained after two minutes.

(FIG. 1B) A 0.30 μm thick single-crystal silicon layer 102 was epitaxially grown over the porous silicon 101 by CVD. The deposition conditions were the same as those in the first example.

(FIG. 1C) The substrate prepared by the above method was processed at 900° C. in a steam ambience to obtain an oxide film 103 of 0.20 μm.

(FIG. 1D) The above substrate 100 having the oxide film, and a support substrate (a bare silicon wafer without a silicon dioxide film) 110 preliminarily prepared were cleaned, then spin-dried, and thereafter bonded to each other. In this case, though the adhesion strength was originally high because of bonding between the Si surface and the $SiO_2$ surface, but after bonding, annealing was further conducted at 1150° C. for five minutes, thereby further enhancing the adhesion strength.

(FIG. 1E) After annealing, the side of silicon substrate 100 was mechanically ground by approximately 550 μm by a grinder. Further, the remaining approximately-40-μm non-porous single-crystal substrate portion was selectively etched in the parallel plate plasma etching system similar to that in the above examples, thereby exposing porous silicon 101. The wafer bonded at this time had variation of thickness, there was also variation of grinding thickness by the grinder device, and further, there was variation of thickness of porous silicon upon anodization. Therefore, the maximum variation of thickness of non-porous single-crystal substrate portion 100 was about 40±5 μm. The etching conditions were as follows.

RF frequency: 13.56 MHz

RF power: 1 kW

Flow rate of $SF_6$ gas: 1000 sccm

Flow rate of oxygen: 300 sccm

Pressure: 20 Pa

Substrate bias: 500 V

Processing time: 11 minutes

The etch rate of non-porous silicon under the above conditions was 5 μm/min while that of porous silicon was 1 μm/min. If the non-porous single-crystal substrate portion 100 is as thin as about 35 μm in the worst case, it will be overetched for 4 minutes. If the non-porous single-crystal substrate portion 100 is as thick as 45 μm, it will be overetched for 2 minutes. Etching thicknesses of underlying porous silicon 101 at this time are 4 μm and 2 μm, respectively, and even in the worst, etching can be stopped within 10-μm porous silicon 101. No specific determination was made for the end point at this time, but for all six substrates set in the etching system, porous silicon was exposed over the entire surface within the processing time set. Their in-wafer-surface distributions of remaining thicknesses of porous silicon were within ±10%.

This substrate was then subjected to wet etching with conventional $HF/H_2O_2$ solution, thereby removing the porous portion.

As a result, the SOI substrate was obtained with an excellent ultra-thin single-crystal silicon film in the film thickness distribution of about 108 nm±3.2 nm (±3%) on the silicon dioxide film of 0.2 μm.

What is claimed is:

1. A process for fabricating a SOI substrate comprising:
   a step of making a portion of a single-crystal Si substrate porous to form a porous single-crystal Si region on a first non-porous single-crystal Si region;
   a step of forming a second non-porous single-crystal Si region over a surface of said porous single-crystal Si region;
   a step of bonding said single-crystal Si substrate onto a support substrate through an insulating region so as to obtain a multilayered structure wherein said second non-porous single-crystal Si region is inside the multilayered structure;
   a step of removing said first non-porous single-crystal Si region; and
   a step of removing said porous single-crystal Si region;
   wherein said step of removing said first non-porous single-crystal Si region comprises a step of performing dry etching in which an etch rate of the non-porous single-crystal Si region is greater than that of the porous single-crystal Si region.

2. The process according to claim 1, wherein said step of removing said first non-porous single-crystal Si region comprises a step of partly grinding said first non-porous single-crystal Si region by a grinder before said step of performing dry etching.

3. The process according to claim 1, wherein said dry etching is etching carried out in such a way that activated ion species are formed by ionization by electric or optical energy, said activated ion species are accelerated in a direction perpendicular to a substrate surface, and a reaction takes place at said substrate surface.

4. The process according to claim 3, wherein determination of an end point of etching where the porous single-crystal Si region is exposed over the entire surface by said dry etching is made by providing a parallel plate electrode on said substrate and observing a change in a self-bias between said parallel plate electrode and said substrate.

5. The process according to claim 1, wherein said step of removing said porous single-crystal Si region is implemented by wet etching in which an etch rate of porous single-crystal Si region is greater than that of non-porous single-crystal Si region.

6. The process according to claim 1, wherein said step of removing said porous single-crystal Si region is implemented by dry etching in which an etch rate of porous single-crystal Si region is greater than that of non-porous single-crystal Si region.

7. The process according to claim 6, wherein said dry etching in which the etch rate of porous single-crystal Si region is greater than that of non-porous single-crystal Si region is etching carried out in such a way that activated radicals resulting from decomposition by at least electric or optical energy intrude into pores of a porous region to etch the porous region from inside.

8. A process for fabricating a SOI substrate comprising:
   a step of making a single-crystal Si substrate having a porous single-crystal Si region on a first non-porous single-crystal Si region and a second non-porous single-crystal Si region on said porous single-crystal Si region;
   a step of bonding said single-crystal Si substrate onto a support substrate so as to obtain a multilayered structure wherein said second non-porous single-crystal Si region is inside the multilayered structure;
   a step of removing said first non-porous single-crystal Si region; and
   a step of removing said porous single-crystal Si region,
   wherein said step of removing said first non-porous single-crystal Si region comprises a step of performing reactive ion etching in which an etch rate of the non-porous single-crystal Si region is greater than that of the porous single-crystal Si region.

9. A process for fabricating a SOI substrate comprising:
   a step of making a single-crystal Si substrate having a porous single-crystal Si region on a first non-porous single-crystal Si region and a second non-porous single-crystal Si region on said porous single-crystal Si region;
   a step of bonding said single-crystal Si substrate onto a support substrate so as to obtain a multilayered structure wherein said second non-porous single-crystal Si region is inside the multilayered structure;
   a step of removing said first non-porous single-crystal Si region; and
   a step of removing said porous single-crystal Si region,
   wherein said step of removing said first non-porous single-crystal Si region comprises steps of grinding said first non-porous single-crystal Si region and then performing reactive ion etching in which an etch rate of the non-porous single-crystal Si region is greater than that of the porous single-crystal Si region.

10. A process for fabricating SOI substrate comprising:
    a step of making a single-crystal Si substrate having a porous single-crystal Si region on a first non-porous single-crystal Si region and a second non-porous single-crystal Si region on said porous single-crystal Si region;
    a step of bonding said single-crystal Si substrate onto a support substrate so as to obtain a multilayered structure wherein said second non-porous single-crystal Si region is inside the multilayered structure;
    a step of removing said first non-porous single-crystal Si region; and
    a step of removing said porous single-crystal Si region,
    wherein said step of removing said first non-porous single-crystal Si region comprises steps of grinding said first non-porous single-crystal Si region and then performing reactive ion etching in which an etch rate of the non-porous single-crystal Si region is greater than that of the porous single-crystal Si region, and wherein said step of removing said porous single-crystal Si region comprises a step of performing wet etching in which an etch rate of the non-porous single-crystal Si region is smaller than that of the porous single-crystal Si region or a step of performing radical etching in which an etch rate of the non-porous single-crystal Si region is smaller than that of the porous single-crystal Si region.

11. A process for fabricating a SOI substrate comprising:

a step of making a surface layer of a single-crystal Si substrate porous to form a porous single-crystal Si region on a first non-porous single-crystal Si region;

a step of forming a second non-porous single-crystal Si region over a surface of said porous single-crystal Si region;

a step of bonding a support substrate through an insulating region to a surface of said second non-porous single-crystal Si region;

a step of removing a portion of said first non-porous single-crystal Si region by means of grinding;

a step of removing a residue of said first non-porous single-crystal Si region by reactive ion-etching in which an etching rate of said non-porous single-crystal Si region is higher than that of said porous single-crystal Si region, after said step of removing the portion of said first non-porous single-crystal Si region by means of grinding; and step of removing said porous single-crystal Si region.

12. The process according to claim 11, wherein said etching is a reactive ion-etching comprised of generating a kind of active ion by means of electric or light energy; and accelerating said kind of the active ion in a direction perpendicular to a face of said substrate, to produce a reaction at said surface of said substrate.

13. The process according to claims 8–11, wherein a surface of an inner wall of a pore of said porous single-crystal Si region is oxidized before the step of forming said second non-porous single-crystal Si region.

14. The process according to claims 8 through 11, wherein said porous single-crystal Si region is heat-treated in a hydrogen atmosphere before the step of forming said second non-porous single-crystal Si region.

15. The process according to claims 8 through 11, wherein a surface of an inner wall of a pore of said porous single-crystal Si region is oxidized before the step of forming said second non-porous single-crystal Si region, followed by heat-treating in a hydrogen atmosphere.

16. The process according to claims 10 or 11, wherein said first non-porous single-crystal Si region is removed by said grinding step so as to attain a thickness of 2 $\mu$m through 300 $\mu$m.

* * * * *

UNITED STATES PATENT AND TRADEMARK OFFICE
CERTIFICATE OF CORRECTION

PATENT NO. : 6,103,009
DATED : August 15, 2000
INVENTOR(S) : TADASHI ATOJI

It is certified that error appears in the above-identified patent and that said Letters Patent is hereby corrected as shown below:

COLUMN 10

Line 57, "to" should be deleted.

COLUMN 13

Line 5, "in" (first occurrence) should be deleted.

COLUMN 20

Line 3, "step" should read --a step--.

Signed and Sealed this

Fifteenth Day of May, 2001

Attest:

NICHOLAS P. GODICI

Attesting Officer

Acting Director of the United States Patent and Trademark Office